(12) United States Patent
Mensch et al.

(10) Patent No.: US 12,123,228 B2
(45) Date of Patent: Oct. 22, 2024

(54) MULTI-SENSOR MODULE, A HANDLE MODULE, AND MOVABLE VEHICLE ELEMENT

(71) Applicant: WITTE Automotive GmbH, Velbert (DE)

(72) Inventors: Reinaldo Mensch, Wuppertal (DE); Christian Zammert, Wuppertal (DE)

(73) Assignee: Witte Automotive GmbH, Velbert (DE)

( * ) Notice: Subject to any disclaimer, the term of this patent is extended or adjusted under 35 U.S.C. 154(b) by 382 days.

(21) Appl. No.: 17/645,068

(22) Filed: Dec. 20, 2021

(65) Prior Publication Data

US 2022/0195759 A1 Jun. 23, 2022

(30) Foreign Application Priority Data

Dec. 22, 2020 (DE) ...................... 10 2020 216 512.2

(51) Int. Cl.
| | | |
|---|---|---|
| E05B 81/00 | (2014.01) | |
| B60R 25/01 | (2013.01) | |
| E05B 77/34 | (2014.01) | |
| E05B 79/06 | (2014.01) | |
| E05B 81/76 | (2014.01) | |
| G01D 5/24 | (2006.01) | |
| G01L 1/14 | (2006.01) | |

(52) U.S. Cl.
CPC .............. *E05B 81/77* (2013.01); *B60R 25/01* (2013.01); *E05B 77/34* (2013.01); *E05B 79/06* (2013.01); *G01D 5/24* (2013.01); *G01L 1/142* (2013.01)

(58) Field of Classification Search
CPC .......... E05B 81/77; E05B 77/34; E05B 79/06; E05B 81/76; E05B 81/78; B60R 25/01; G01D 5/24; G01L 1/142; H03K 17/975
See application file for complete search history.

(56) References Cited

U.S. PATENT DOCUMENTS

| | | | | |
|---|---|---|---|---|
| 2008/0256755 A1* | 10/2008 | Ieda | ........................ | E05B 49/00 16/412 |
| 2014/0246873 A1* | 9/2014 | Raulin | .................... | E05B 81/78 292/336.3 |
| 2017/0044816 A1* | 2/2017 | Salter | ........................ | B60J 5/101 |
| 2020/0157873 A1* | 5/2020 | Sabatini | .................. | E05B 81/76 |

(Continued)

FOREIGN PATENT DOCUMENTS

| | | |
|---|---|---|
| CN | 102575495 A | 7/2012 |
| CN | 106687655 A | 5/2017 |

(Continued)

OTHER PUBLICATIONS

China National Intellectual Property Administration, Office Action in Application No. CN202111562774.X dated Feb. 25, 2023, 16 pages.

(Continued)

*Primary Examiner* — Francis C Gray
(74) *Attorney, Agent, or Firm* — Marshall & Melhorn, LLC

(57) ABSTRACT

An outside door handle module for a vehicle may have one handle element having a handle outer side and a handle inner side. The module may also have one gesture sensor and an actuation sensor. The gesture sensor may be arranged on or in the handle outer side and the actuation sensor may be arranged on or in the handle inner side.

18 Claims, 10 Drawing Sheets

(56) References Cited

U.S. PATENT DOCUMENTS

2020/0252063 A1\* 8/2020 Mokuo ................ H03K 17/955
2021/0302147 A1\* 9/2021 Chabrowski ............ E05B 81/77

FOREIGN PATENT DOCUMENTS

| CN | 111946175 A | 11/2020 |
|----|----|----|
| DE | 19907295 C1 | 2/2001 |
| DE | 102007028898 A1 | 12/2008 |
| DE | 102014107977 A1 | 12/2015 |
| DE | 102015103516 A1 | 9/2016 |
| DE | 102015122086 A1 | 6/2017 |
| DE | 102016109933 A1 | 11/2017 |
| DE | 102017109328 A1 | 9/2018 |
| WO | 2017009073 A1 | 1/2017 |
| WO | 2018012329 A1 | 1/2018 |

OTHER PUBLICATIONS

German Patent and Trademark Office, Office Action in Application No. DE 10 2020 216 512.2, dated Nov. 18, 2021, 7 pages, Munich Germany.

European Patent and Trademark Office, Extended European Search Report for application No. EP 21 216 920.5, dated May 3, 2022, 8 pages.

\* cited by examiner

MULTI-SENSOR MODULE, A HANDLE MODULE, AND MOVABLE VEHICLE ELEMENT

FIELD

The invention relates to a multi-sensor module and to a handle module, in particular for a handle, such as an outside handle for a movable vehicle element, in particular for a sliding door, a tailgate, or an engine/front hood of a vehicle. The invention also relates to a movable vehicle element having such a handle module and such a multi-sensor module.

BACKGROUND

Handle modules are known, for example, on vehicle doors, tailgates, or engine hoods. These are usually provided with a handle element which may be pivoted outwards in order to be able to open the vehicle door, the tailgate, or the engine hood. Handle modules can comprise electronic multi-sensor modules for opening a lock on the door.

SUMMARY

The invention is based on the object of specifying a multi-sensor module which is improved over the prior art, has a compact structure, and allows simplified assembly. Furthermore, a handle module with such an improved multi-sensor module and a movable vehicle element having such a handle module are to be specified.

With regard to the multi-sensor module, the object is achieved according to the invention with the features specified in the claims. With regard to the handle module, the object is achieved according to the invention by the features specified in the claims.

With regard to the movable vehicle element, the object is achieved according to the invention by the features specified in the claims.

Developments of the invention are the subject matter of the dependent claims.

The multi-sensor module according to the invention, in particular a universal electronic multi-sensor module for a handle, such as a door handle, comprises at least one first sensor unit, which is designed as an approach and/or gesture sensor, one second sensor unit, which is designed as an actuation sensor, and one electronics unit that is electrically connected to the sensor units for triggering a signal, wherein the actuation sensor is designed as a component which is encapsulated and integrated by means of a foam material at least in some regions and can be mounted on one side of the electronics unit, and the approach and/or gesture sensor is designed in segments and can be mounted on an opposite side of the electronics unit.

The multi-sensor module is preferably additionally surrounded at least in some regions by a potting material and is designed as an integrated structural unit, in particular a separate assembly module. In addition, the encapsulated and integrated component of the actuation sensor can form a preassembly unit which can be mounted on the electronics unit in a preassembly state.

The advantages achieved with the invention are, in particular, that such a multi-sensor module, designed as an integrated structural unit, in particular as a separate assembly module, can be variably mounted on a handle. In particular, both the electronics of the electronics unit and the first and second sensor units are protected from external environmental influences such as moisture, rain, and dirty water.

For simple coupling of the actuation sensor to the electronics unit, connection elements of the actuation sensor protrude from the foam material and can be or are connected, for example soldered, to the electronics unit.

One possible embodiment provides that the actuation sensor comprises a movable sensor element and a fixed sensor element arranged spaced apart from and opposite the movable sensor element, wherein at least the movable sensor element is separately encapsulated at least in some regions by means of the foam material and forms the integrated component, wherein connection elements of the movable sensor element protrude from the foam material and can be connected or are connected to the electronics unit.

The movable sensor element is encapsulated in some regions by means of the foam material in such a way that it is protected from external environmental influences such as moisture, rain, and dirty water. In addition, a resilient material is provided as the foam material such that the movable sensor element is additionally resiliently mounted. The foam material can perform a connecting, resetting, and sealing function at the same time. For example, the movable sensor element for the connecting function can be connected to the electronics unit by means of the foam material. In addition, the foam material for a resetting function can be designed in such a way and encapsulate the movable sensor element in such a way that it is automatically reset to a starting position or rest position after the end of a triggering movement.

The advantages achieved with the invention are in particular that the movable sensor element of the actuation sensor is movably supported by means of the foam material in the multi-sensor module, wherein the foam material assumes a connecting, resetting, and sealing function.

In a further development, the movable sensor element is designed as a resilient trigger element. This allows for a manually force-controlled pressure switch having a resetting function in a simple manner. In addition, the movable sensor element can be switched as an electronic sensor element, in particular a capacitive sensor electrode. As a result, the movable sensor element can also be used to detect an approach of an object and thus serve as an approach and/or gesture sensor.

One possible embodiment provides that the movable sensor element comprises a base element which is encapsulated completely or in some regions by the foam material. The base element forms a resilient trigger element which is provided with the foam material at least in the direction of the fixed sensor element. For example, the base element is designed as a trigger plate, in particular a leaf spring, a spring sheet, or a sheet metal plate. The connection elements of the movable sensor element are preferably designed as surface connection elements (=so-called SMD connection elements).

In addition, the first sensor unit and/or the second sensor unit can each be surrounded at least in some regions by a potting material. Hereby, the sensor units themselves are protected from external influences such as moisture, mechanical loads, dirt, water, and rain.

In one possible embodiment, the first sensor unit is designed as a capacitive sensor for detecting an approach of an object to the multi-sensor module and/or for detecting a gesture by a user.

The second sensor unit is designed in particular as a force sensor, in particular a force-controlled capacitive or inductive sensor, for performing a switching function, such as, for example, unlocking a door lock and opening a door.

To actuate the movable sensor element, a separate actuation element is provided, for example, which is arranged above and/or below the movable sensor element of the second sensor unit. The actuation element can be encapsulated in some regions or completely by the foam material and be part of the integrated component. For example, in the case of an arrangement below the movable sensor element, the actuation element can be part of the integrated component. In the case of an arrangement above the movable sensor element, this can be arranged at a distance from the movable sensor element. In a further alternative, the actuation element arranged above the movable sensor element can be arranged directly on the movable sensor element and surrounded by the foam material and thus form part of the integrated component.

A handle module according to the invention, in particular an outside handle module for a movable vehicle element, in particular a door of a vehicle, comprises at least one handle element and one multi-sensor module which is designed as an integrated structural unit and can be or is arranged as an assembly unit on or in the handle element. This allows a variable arrangement of the multi-sensor module inside the handle element or outside on the handle element.

The handle element comprises, for example, a handle outer side and a handle inner side, wherein the structural unit can be mounted in the handle element in such a way that an approach and/or gesture sensor of the multi-sensor module is arranged on the handle outer side and an actuation sensor of the multi-sensor module is arranged on the handle inner side.

The advantages achieved with the invention are, in particular, that the combination of an approach and/or gesture sensor and an actuation sensor in a handle module ensures that the movable vehicle element is opened safely by means of the actuation sensor, combined with a comfort function for the movable vehicle element by means of the gesture sensor. The sensors—approach sensors, gesture sensors, and/or actuation sensors—are protected, in particular arranged in an encapsulated manner in the handle module and thus protected from environmental stresses. In addition, the approach sensor, gesture sensor, and/or actuation sensor can be combined with one another for signaling purposes, whereby further comfort functions are made possible and disturbance variables such as environmental influences, in particular ambient temperatures, air humidity, can be filtered, so that false triggering is avoided.

In particular, through the combination of the external approach and/or gesture sensor with the internal actuation sensor, environmental influences, such as those that occur in a car wash for a vehicle, can be reliably filtered and recognized so that false triggering can be safely avoided.

In addition, the handle module can be equipped with a mechanical emergency actuation. For example, by pressing on a front outer region of the handle, the handle element, in particular its actuation element, pivots to the outside and releases an engagement in which an additional emergency actuation handle for a Bowden cable is accessible for manual unlocking and opening of the door lock.

In one possible embodiment, the handle element comprises an actuation element having an outer actuation surface and a handle support on which the actuation element is held. The actuation element is arranged on the handle outer side and the handle support is arranged on the handle inner side.

In the installed state, the handle outer side is understood to be an externally accessible side of a movable vehicle element, such as a vehicle door or a tailgate. In the installed state, the handle inner side is understood to mean a side of the handle element pointing in the direction of the movable vehicle element.

The actuation sensor is designed for automatic unlocking and automatic opening of the door lock of the door and can be designed as an integrated module and be arranged in a preassembled manner on or in the multi-sensor module. The multi-sensor module is in turn designed as a separate, integrated structural unit, in particular as an assembly module which can be variably mounted on or in the handle support. In addition, the multi-sensor module can be arranged on or in the handle support. For example, the multi-sensor module can be arranged and held in a form-fitting and/or force-fitting manner, for example by means of a latching connection, clip connection, plug connection, tongue and groove connection, or in another suitable connection on or in the handle support.

In addition, the design of the handle module with the manual actuation element means that an electric door lock can be safely triggered by pressing it, wherein the actuation sensor located on the inside is arranged in a protected manner and can additionally be encapsulated, in particular encased or encapsulated.

A further development provides that the handle support and the actuation element surround the actuation sensor. Due to the design of the actuation sensor as an integrated module and the additional encapsulation of the actuation sensor by the handle support and the actuation element, an additional sealing plane is provided on the outer side of the handle module, so that the actuation mechanism, in particular a lifting mechanism, of the actuation element is also sealed off.

One possible embodiment provides that the actuation sensor is arranged and mounted in the handle support on an inner side of the handle support in the region of a through opening and opposite the actuation element. This allows a compact design of the handle module and small actuation strokes.

In a further embodiment, the actuation sensor is coupled to the electronics unit. By coupling with the electronics unit, the handle module can take over and execute further functions, for example further electronic handle, lock, and/or door functions.

For example, the electronics unit comprises a printed circuit board having a first surface side and a second surface side. An integrated circuit arrangement, for example multi-function electronics for one or more functions, in particular for one or more electronic handle, lock, and/or door functions, is arranged on the first surface side. The actuation sensor is arranged on the opposite, second surface side.

Furthermore, the actuation element has an inner side opposite an outer actuation surface, which inner side is sealingly connected to the handle support by means of a connecting element, at least in the region of the through opening. As a result, the internal electronics unit is arranged in such a way that it is protected from damage.

A further development provides that the actuation sensor is designed as a force sensor, in particular a force-controlled capacitive sensor, for unlocking and opening the door lock and the door. In particular, the actuation sensor is designed as a so-called MOC module (=metal-over-cap module), in which the metallic sensor components located on the inside are encapsulated from the outside. The actuation sensor is acted upon by force, for example by a pressure force on the handle outer side. If the force exceeds a specified threshold value, this is identified as an opening request and the door lock is safely unlocked. The triggering of the unlocking takes place, for example, by pressing the handle module on the handle inner side against the actuation surface away from the vehicle body, so that the actuation element is pressed into the handle inner side. With a sufficiently large actuation stroke of the actuation element into the handle inner side, the actuation element takes along the movable sensor element, in particular a spring sheet or a metal spring, and also presses it into the handle inner side, whereby the distance to the fixed sensor element, in particular a metal layer, for example a copper layer on the second surface side of the printed circuit board, is changed and when a predetermined threshold value is exceeded, an opening signal is generated and, for example, the door lock is unlocked or a door movement is stopped.

For example, the actuation sensor also comprises a sensor housing. The fixed sensor element can for example be arranged directly on the second surface side of the printed circuit board. The movable sensor element can in particular be arranged at a distance from the fixed sensor element in a receiving opening of the sensor housing. The sensor housing and the movable sensor element encapsulate from the outside the fixed sensor element located on the inside. The sensor housing is in particular a plastics housing and can be molded, in particular injection molded, onto the printed circuit board. The sensor housing can be designed as a 2-component housing. For example, the sensor housing can have a soft housing wall located on the inside and an outer hard housing wall surrounding it. The sensor housing serves as a seal against moisture and contamination of the interior of the sensor unit.

In the built-in state of the actuation sensor in the handle module, the movable sensor element is arranged in the region of the through opening in such a way that it at least partially covers the through opening from the inside. In addition, the actuation element is arranged in the region of the through opening in such a way that it at least partially covers the through opening from the outside. In particular, the actuation element protrudes into the through opening at least in some regions in such a way that it is arranged spaced apart from the movable sensor element in an unactuated position. This allows a compact design of the handle module and small actuation strokes. In addition, the actuation forces can be set; in particular, threshold values can be specified.

Another embodiment provides that the actuation element comprises a pressure transmission element which protrudes inward from the outer actuation surface in the direction of the actuation sensor. For example, the actuation element comprises an inwardly protruding actuation plunger, in particular a pressure pin, for example a bolt or pin, which can be moved in the pressure direction to actuate the movable sensor element. In particular, the actuation element can be actuated in such a way that it can be moved in the pressure direction through the through opening to the movable sensor element, for example a trigger element, and moves this in the direction of the fixed sensor element upon further pressure actuation. As a result, the distance between the movable sensor element and the fixed sensor element is changed, in particular reduced, so that a measuring field present between them changes. For this purpose, the movable sensor element, in particular the trigger element, is designed, for example, as a metallic leaf spring, a spring plate, or a spring sheet.

Furthermore, the actuation element can have an inner side opposite an outer actuation surface, which inner side is sealingly connected to the handle support by means of a connecting element, at least in the region of the through opening. The connecting element can additionally be designed as a resetting element which, when the actuation element is actuated from an unactuated position to an actuated position, resets it to the unactuated position when the actuation element is not actuated. For example, the connecting element is designed as a plastics strand, in particular a rubber or foam strand. On the side of the actuation element facing the actuation sensor, the connecting element can form a circumferential sealing strand arranged in the edge region of the through opening. Alternatively or additionally, the connecting element can surround the actuation element on the side facing the actuation sensor and seal it against moisture and contamination. For this purpose, the connecting element is formed from a soft component material, in particular from a foam, plastics, or rubber material.

The approach and/or gesture sensor is designed, for example, as a segmented capacitive sensor with a plurality of capacitive sensor segments. The approach and/or gesture sensor is arranged, for example, on an outer side of the actuation element, in the actuation element in the region of the outer actuation surface, and/or on the surface side of the electronics unit facing the handle outer side. The sensor segments are combined for signaling purposes and connected to evaluation electronics of the electronics unit in a conventional manner for non-contact detection of an object approach and/or a gesture, so that, for example, a non-contact wiping movement in the region of the outer gesture sensor is recognized due to capacitive changes in the sensor segments. Due to the time offset of the capacitive changes in the sensor segments, a direction of the non-contact wiping movement can be detected and a movement signal for the movable vehicle element in the determined direction can be triggered accordingly. so that the movable vehicle element is moved in the determined direction.

By means of the inner actuation sensor, the triggered movement of the vehicle element, such as a door, can then be stopped at any desired position by selective touching of the actuation surface and, if desired, can be restarted by touching again, in particular pressing, the actuation surface.

In addition, a locking sensor can be integrated in the handle module, which identifies and triggers a locking command for the door lock when the vehicle element, in particular the door, front hood/engine hood, or tailgate is closed.

The invention further relates to a movable vehicle element which comprises at least one handle module, as described above, in or on which the multi-sensor module can be arranged or is arranged. The movable vehicle element can be an element which can be opened manually or electrically, in particular pivoted open or pushed open, such as a vehicle door, a sliding door, a front hood or engine hood, or a tailgate of a vehicle.

DESCRIPTION OF THE FIGURES

Embodiments of the invention are explained in greater detail with reference to the drawings, in which.

DETAILED DESCRIPTION

Parts corresponding to one another are provided with the same reference signs in all figures.

Figure 1:
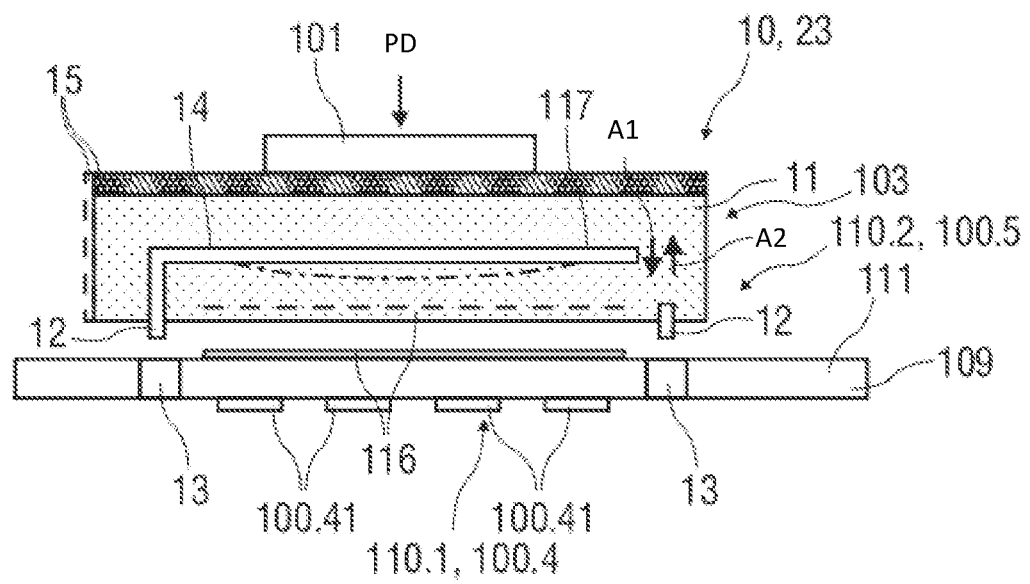
FIG. 1 is an exploded view of a first embodiment of a multi-sensor module.
Figure 2:
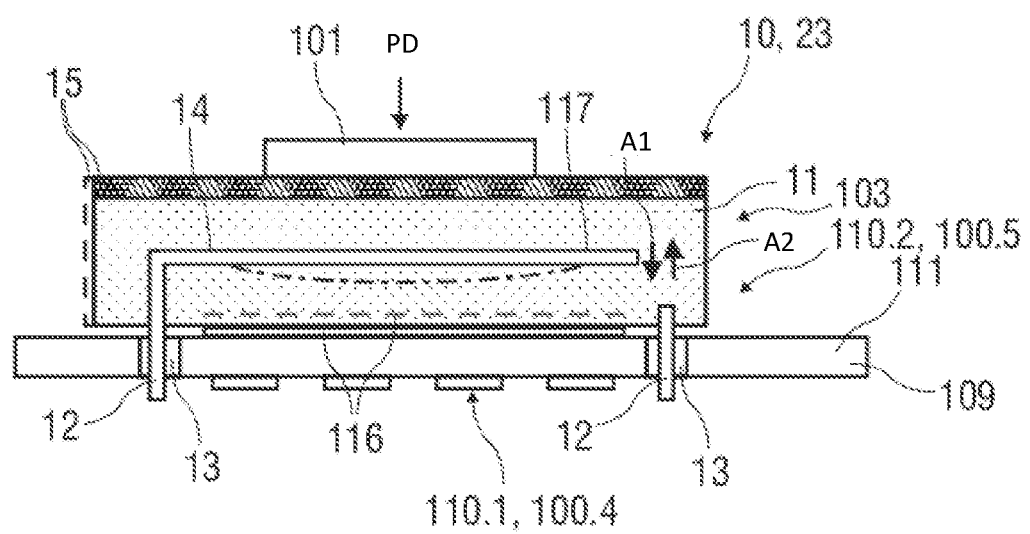
FIG. 2 shows the first embodiment of the multi-sensor module according to FIG. 1 in the assembled state.

FIG. 1 is a schematic exploded view of a possible embodiment for a multi-sensor module 10, in particular an electronic multi-sensor module 10. FIG. 2 shows the multi-sensor module 10 in an assembled version.

The multi-sensor module 10 comprises at least one electronics unit 109, one first sensor unit 110.1, and one second sensor unit 110.2. The first sensor unit 110.1 is designed as an approach and/or gesture sensor 100.4. The second sensor unit 110.2 is designed as an actuation sensor 100.5.

The electronics unit 109 is electrically connected to the sensor units 110.1, 110.2 for triggering a signal, in particular a switching signal. The actuation sensor 100.5 is designed as a component 103 which is at least encapsulated and integrated in some regions by means of a foam material 11 and can be mounted or is mounted on one side of the electronics unit 109.

The approach and/or gesture sensor 100.4 is designed to be segmented and can be mounted or is mounted on an opposite side of the electronics unit 109. For example, the approach and/or gesture sensor 100.4 comprises a plurality of sensor segments 100.41. The approach and/or gesture sensor 100.4 is designed, for example, as a segmented capacitive sensor for gestures. The sensor segments 100.4 recognize the capacitive change in the event of a non-contact wiping movement. Due to a time offset of the capacitive change in the individual sensor segments 100.4, a direction of the wiping movement can be detected. From this, for example, a movement request for a movable vehicle element 201, for example a vehicle door 202 (shown in FIG. 13), can be derived, so that a corresponding controller moves the vehicle door 202 in the desired direction.

The actuation sensor 100.5 reacts to a mechanical load, for example to an application of force, for example a compressive force. This allows an opening request to be reliably triggered. For example, a pressure force is applied to the handle element 100.1 in the region of the actuation sensor 100.5 by pressing it in the direction of the vehicle body, which changes a distance between the actuation sensor 100.5, in particular a distance between an MoC sheet and the electronics unit 109. If a threshold value for the distance is exceeded, a corresponding opening request is detected and a corresponding lock is opened or unlocked.

The multi-sensor module 10 thus combines an outer segmented capacitive approach and/or gesture sensor 100.4 with an inner actuation sensor 100.5, in particular a pressure sensor, for example a so-called MoC sensor. This combination allows safe opening, for example of a sliding door, by means of the actuation sensor 100.5 and a comfort function by means of the segmented approach and/or gesture sensor 100.4. An associated handle module 100 (shown in FIG. 10ff.) can thus be opened plausibly and safely via a sensor diversity, in particular a mechanical sensor redundancy.

Such a combination of the actuation sensor 100.5 with outer sensor segments 100.41 for the gesture function allows external influences, such as the wetness of a car wash, to be reliably differentiated and filtered from the actuation request. For example, if all sensor segments 100.41 detect a change at the same time, no opening request is detected.

In addition, the multi-sensor module 10 can additionally be surrounded at least in some regions by a potting material 15 and be designed as an integrated structural unit 23. In particular, the encapsulated and integrated component 103 forms a preassembly unit which can be mounted or is mounted on the electronics unit 109 in a preassembly state.

The second sensor unit 110.2, in particular the actuation sensor 100.5, comprises at least one fixed sensor element 116 and one movable sensor element 117.

The fixed sensor element 116 is spaced apart from and arranged opposite the movable sensor element 117. The electronics unit 109 is connected to the sensor elements 116, 117 for triggering a switching signal. The electronics unit 109 comprises, for example, a printed circuit board 111.

The fixed sensor element 116 is designed, for example, as a metal layer, in particular a copper layer, on the printed circuit board 111.

In addition, the movable sensor element 117 is encapsulated at least in some regions by means of a foam material 11 and forms the integrated component 103.

The encapsulated and integrated component 103 can form a preassembly unit with the actuation sensor 100.5, as shown in FIG. 1 in an exploded view. The preassembly unit and thus the component 103 can then be mounted (in an encapsulated manner) on one side of the electronics unit 109 in this preassembly state. The segmented approach and/or gesture sensor 100.4 can be mounted or is mounted on the opposite side of the electronics unit 109. In the assembled state of the integrated component 103 on the electronics unit 109, these together form the integrated structural unit 23 of the sensor module 10.

As shown in FIG. 1 with the aid of the dashed representation of the fixed sensor element 116, the fixed sensor element 116 can optionally also be encapsulated by the foam material 11.

To connect the movable sensor element 117 of the integrated component 103 to the electronics unit 109, the movable sensor element 117 comprises connection elements 12 which protrude from the foam material 11 and are to be connected (FIG. 1) or are connected, for example soldered (FIG. 2) to the electronics unit 109.

FIGS. 1 and 2 show plug contacts as connection elements 12. For this purpose, the connection elements 12 are designed as vertical electrical plug connections which are inserted through the through openings 13 of the printed circuit board 111 and which are then connected, in particular soldered, to the printed circuit board 111 on the opposite side via a conductor track or a connection contact.

The movable sensor element 117, for example a spring element such as a leaf spring or a metal sheet, is encapsulated in some regions by means of the foam material 11 in such a way that it is protected from external environmental influences such as moisture, rain, and dirty water. At least the movable sensor element 117 is surrounded by the foam material 11 and together with it forms the integrated component 103. The connection elements 12 thus also protrude from the integrated component 103.

In addition, such a resilient material is provided as the foam material 11, by means of which the movable sensor element 117 is additionally resiliently mounted.

In this case, the foam material 11 can simultaneously execute a connecting, resetting, and sealing function. For the connecting function, the movable sensor element 117 can optionally be connected to the electronics unit 109, in particular the printed circuit board 111, by means of the foam material 11. In addition, the foam material 11 can be designed for a resetting function and encapsulate the movable sensor element 117 in such a way that this is automatically reset to a starting position or rest position after the end of a triggering movement, as shown by the arrows A1, A2.

By means of the foam material 11, the movable sensor element 117 is movably mounted in the multi-sensor module 10, the foam material 11 assuming a connecting, resetting, and sealing function. Optionally, the fixed sensor element 116 of the second sensor unit 110.2 can also be encapsulated by the foam material 11.

In a further development, the movable sensor element 117 is designed as a resilient trigger element. As a result, the second sensor unit 110.2 can as a manually force-controlled pressure switch with a resetting function. For example, the second sensor unit 110.2 is designed as a force sensor, in particular a force-controlled capacitive or inductive sensor, for performing a switching function.

For this purpose, an actuation element 101 is additionally provided, which is arranged, for example, above the movable sensor element 117, a resilient trigger element.

FIGS. 1 and 2 show the actuation element 101 as a plunger or push button which is arranged above the foam material 11. The actuation element 101 can in particular be actuated in the pressure direction PD.

In addition, the movable sensor element 117 can be switched as an electronic sensor element, in particular a capacitive sensor electrode, by means of the electronics unit 109. As a result, the second sensor unit 110.2 can be used not only as a pressure switch but also to detect an approach of an object and thus serve as an approach sensor.

The movable sensor element 117 comprises a base element 14 which is encapsulated completely or in some regions by the foam material 11. The movable sensor element 117 is provided with the foam material 11 at least in the direction of the fixed sensor element 116. In other words: The foam material 11 is arranged at least between the movable sensor element 117 and the fixed sensor element 116.

The base element 14 is designed in particular as a trigger plate, in particular a spring sheet or a sheet metal plate. In the embodiment according to FIGS. 1 and 2, the connection elements 12 are designed as plug-in contacts and protrude vertically downward from the foam material 11.

In addition, the second sensor unit 110.2 can be surrounded at least in some regions by a potting material 15. In particular, an outer layer around the foam material 11 can optionally be provided with the potting material 15. In addition, the sensor module 10, in particular its electronic components preassembled with one another, such as the sensor units 110.1, 110.2 and the electronics unit 109, can be surrounded at least in some regions by the potting material 15. The sensor module 10 is designed as an integrated structural unit 23, in particular a separate assembly unit or a separate assembly module.

The first sensor unit 110.1 is designed as an approach and/or gesture sensor 100.4, in particular as a conventional capacitive sensor.

The approach and/or gesture sensor 100.4 is used in particular for the non-contact detection of an approach and/or movement of an object, such as a hand, of the multi-sensor module 10.

The approach and/or gesture sensor 100.4 is designed, for example, as a segmented capacitive sensor having a plurality of capacitive sensor segments 100.41. The sensor segments 100.41 are combined for signaling purposes and connected to evaluation electronics of the electronics unit 109, so that, for example, a non-contact approach of a hand and/or a swiping movement in the region of the outer approach and/or gesture sensor 100.4 is recognized on the basis of capacitive changes in the sensor segments 100.41.

Figure 3:
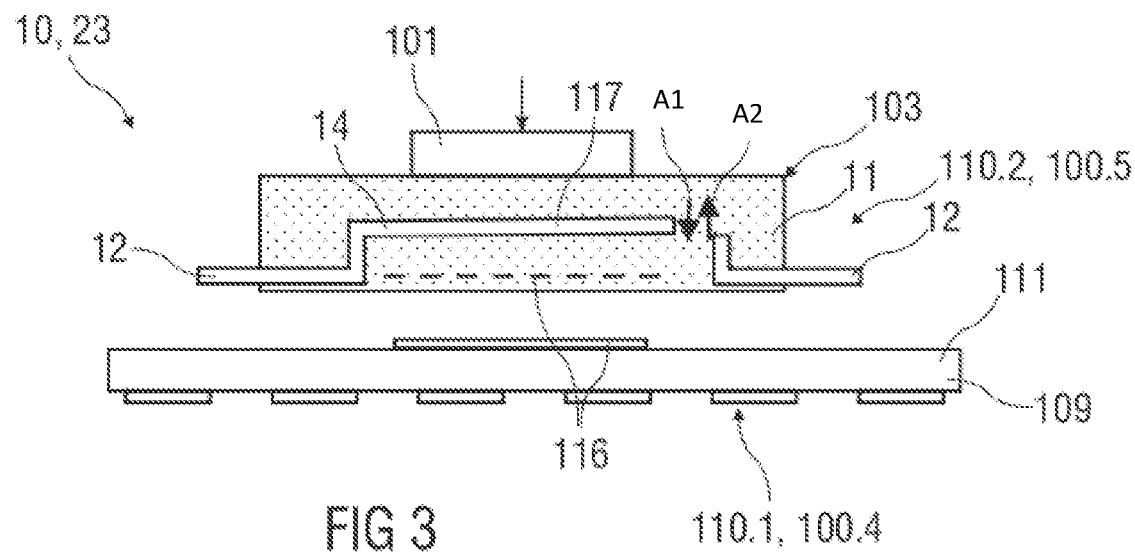
FIG. 3 is an exploded view of a second embodiment of a multi-sensor module.
Figure 4:
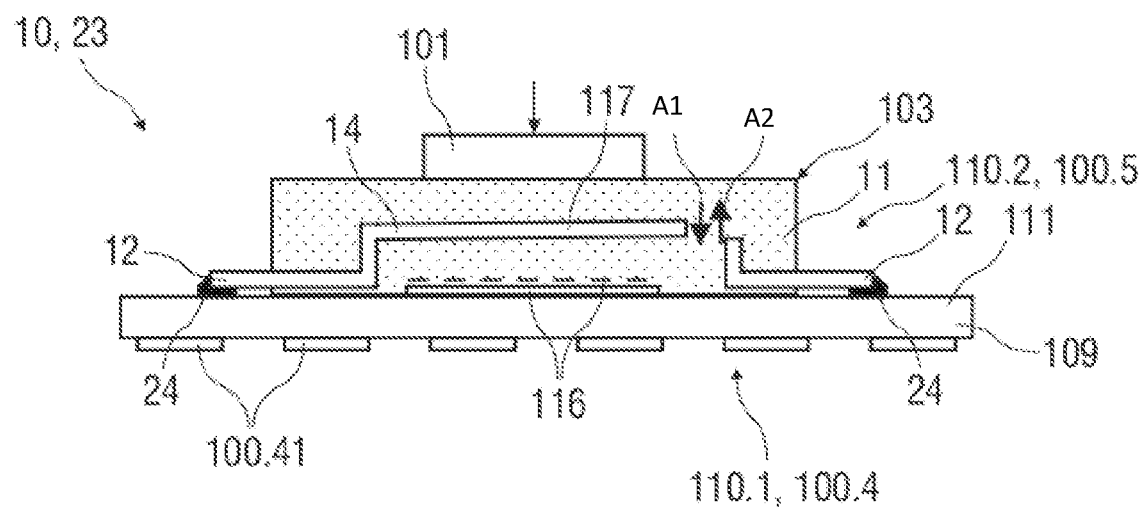
FIG. 4 shows the second embodiment of the multi-sensor module according to FIG. 3 in the assembled state.

FIGS. 3 and 4 show a further optional embodiment of the electronic multi-sensor module 10. Instead of plug contacts, the connection elements 12 are designed as surface connection elements (=so-called SMD connections) of the integrated component 103, in particular the preassembly unit, and protrude horizontally from the foam material 11, so that these connection elements 12 can be connected (FIG. 3) or are connected (FIG. 4) to the electronics unit 109, in particular to a conductor track on the upper surface side of the printed circuit board 111. For example, the connection elements 12 are soldered directly onto the printed circuit board 111 as solderable connection surfaces 24.

Such a design of the second sensor unit 110.2, in particular the actuation sensor 100.5, with connection elements 12 as surface connection elements allows for a large-area use of the opposite side of the printed circuit board for the first sensor unit 110.1. As a result, more sensor segments 100.41 can be provided for the multi-sensor module 10 and thus a larger area can be used as an approach and/or gesture sensor 100.4.

Figure 5:
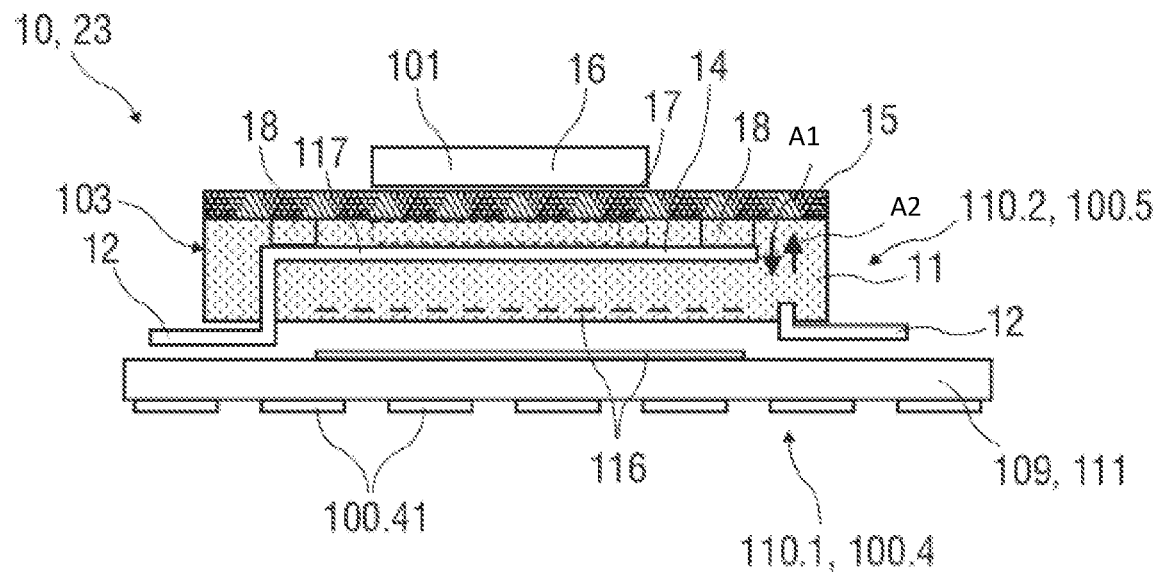
FIG. 5 is an exploded view of a third embodiment of a multi-sensor module.

FIG. 5 shows a further optional embodiment of the electronic multi-sensor module 10 having an at least partially encapsulated actuation element 101. In the embodiment according to FIG. 5, the actuation element 101 is designed in two parts and comprises an actuation plunger 16 and a counter plunger 17 arranged in the foam material 11. In addition, spacer elements 18 can be provided in order to limit the actuation movement, in particular a stroke movement, of the actuation element 101. These spacer elements 18 can also be provided for the electronic multi-sensor module 10 in the other embodiments shown. The spacer elements 18 can be designed as a circumferential strand of material and, in addition to the support function and stop function, realize a sealing function.

Figure 6:
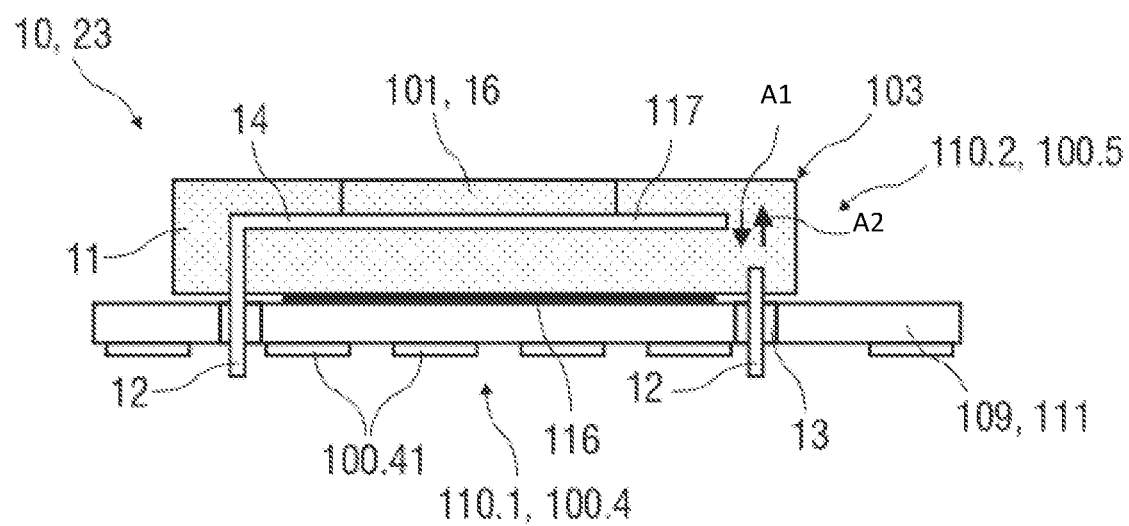
FIG. 6 shows a fourth embodiment of a multi-sensor module in the assembled state.

FIG. 6 shows a further optional embodiment of the electronic multi-sensor module 10, the actuation element 10 as actuation plunger 16 being completely encapsulated by the foam material 11 and thus part of the integrated component 103, in particular the preassembly unit.

In a further embodiment (not shown in detail), a multi-part actuation element 101 can comprise a counter plunger 17 which is designed below the movable sensor element 117 as part of the integrated component 103, and an actuation plunger 16 which is arranged above the movable sensor element 117.

Figure 7:
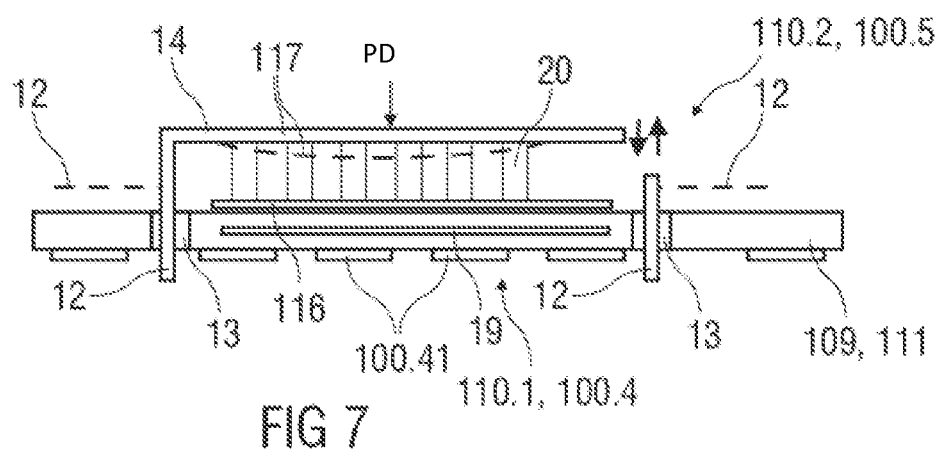
FIG. 7 shows a fifth embodiment of a multi-sensor module in the assembled state.

FIG. 7 shows the design of the second sensor unit 110.2 as a capacitive sensor, the movable sensor element 117 and the fixed sensor element 116 each forming electrodes which are spaced apart from one another so that a measuring field 20 is formed between them when the second sensor unit 110.2 is activated, so that when the movable sensor element 117 is pressed in the pressure direction PD, the change in the capacitive measuring field 20 is detected and used to determine the actuation stroke, in order to trigger a switching function with a sufficiently large actuation stroke.

In addition, a shield 19, in particular as a metal layer in the printed circuit board 111, can be provided on the side of the fixed sensor element 116 facing away from the movable sensor element 117. For a better overview, the foam material 11 and the actuation element 101 have not been shown.

Figure 8:
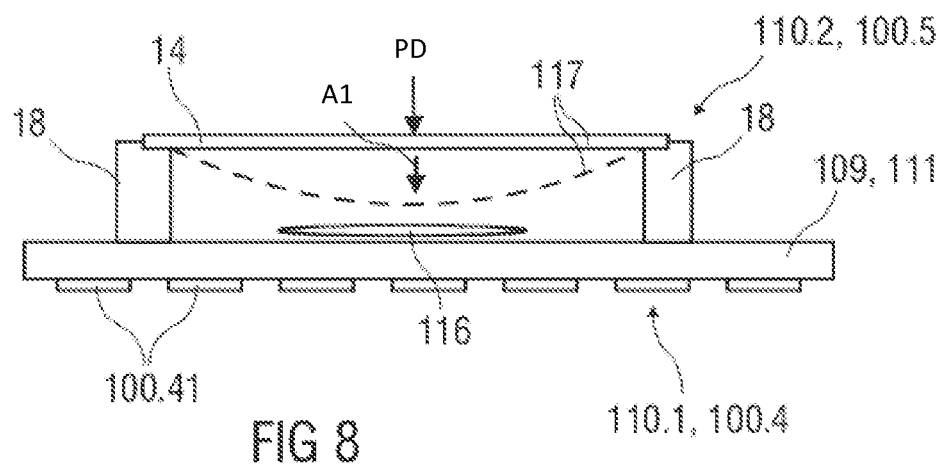
FIG. 8 shows a sixth embodiment of a multi-sensor module in the assembled state.

FIG. 8 shows the design of the second sensor unit 110.2 as an inductive sensor, the movable sensor element 117 being designed as a metal spring or sheet metal and the fixed sensor element 116 being designed as a coil, which are spaced apart from one another, so that when the movable sensor element 17 is pressed in the pressure direction PD, the change in the inductance of the coil is detected and used to determine the actuation stroke/force in order to trigger a switching function in the event of a sufficiently large change in inductance.

Figure 9:
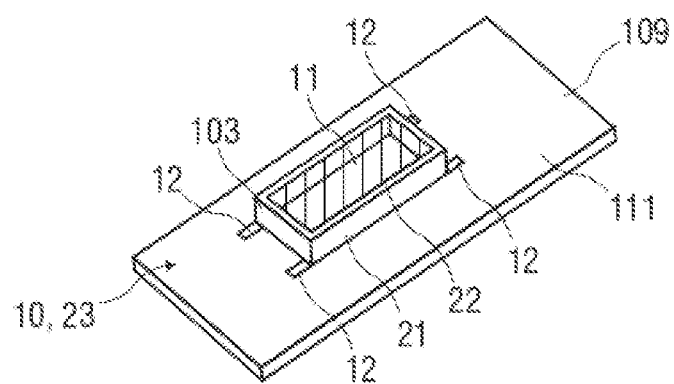
FIG. 9 is a perspective view of a multi-sensor module as an assembly unit, FIG. 10 schematically shows a sectional view of a handle module with a multi-sensor module.

FIG. 9 shows the electronic multi-sensor module 10 in a perspective illustration with the electronics unit 109 as a printed circuit board 111 and the integrated component 103, comprising the foam material 11 and movable sensor elements 117 encapsulated therein. The foam material 11 can additionally be surrounded by a sensor housing 21. The sensor housing 21 can also be provided with a sealing strand 22 for additional sealing of the integrated component 103. The integrated component 103 as a preassembly unit is mounted on one side of the electronics unit 109. In addition, the integrated component 103 is signal-connected via the connection elements 12 to the electronics unit 109.

The electronic multi-sensor module 10 can be preassembled with all components, the electronics unit 109, the first sensor unit 110.1 (not shown in FIG. 9, because the electronics unit 109 is arranged on the opposite side) and the second sensor unit 110.2 to form an integrated structural unit 23, which structural unit can be assembled as a whole in a handle module 100 which is described below by way of example.

Figure 10:
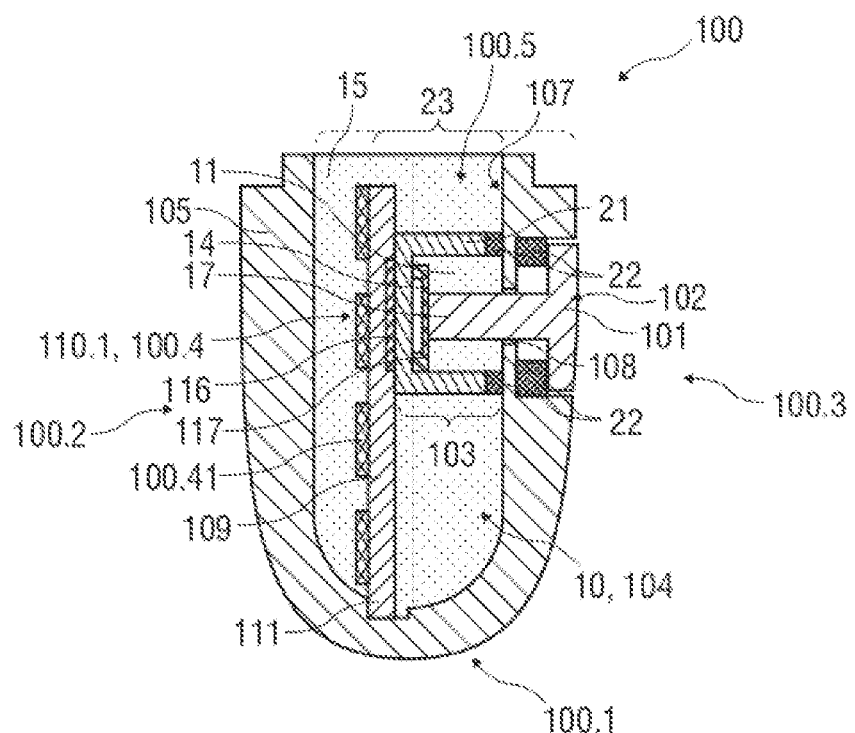

FIG. 10 shows a possible embodiment for a handle module 100 with an electronic multi-sensor module 10, which multi-sensor module is arranged as an integrated structural unit 23 in the handle module 100.

The handle module 100 is an outside handle module for a movable vehicle element 201, in particular a vehicle door 202 of a vehicle 200, as shown in detail in the following FIGS. 11 to 19.

The handle module 100 comprises, for example, at least the electronic multi-sensor module 10 as an integrated structural unit 23 and a handle support 105, on or in which the multi-sensor module 10 is preassembled and then arranged in an encapsulated manner. The integrated structural unit 23 is in turn preassembled as a preassembly unit on the multi-sensor module 10.

The electronic multi-sensor module 10 in the form of the integrated structural unit 23 can be installed, in particular preassembled, as a whole in the handle module 100.

These components are arranged in a protected manner due to the design of the handle module 100 with the multi-sensor module 10 located on the inside with encapsulated electronic components, the first sensor unit 110.1 as an approach and/or gesture sensor 100.4, and the second sensor unit 110.2 as an actuation sensor 100.5. In addition, the multi-sensor module 10 can be encapsulated within the handle module 100 by means of a potting material 15.

The handle module 100 comprises a handle element 100.1 which has a handle outer side 100.2 and a handle inner side 100.3.

The multi-sensor module 10 is arranged in the handle module 100 in such a way that the approach and/or gesture sensor 100.4 of the multi-sensor module 10 is arranged on or in the handle outer side 100.2 and the actuation sensor 100.5 is arranged on or in the handle inner side 100.3.

In one possible embodiment, the electronic multi-sensor module 10 is designed as a triggering unit 104 for automatically triggering a function, in particular for triggering an unlocking and automatic opening of the door lock of the vehicle door 202. By integrating the electronics unit 109, the first sensor unit 110.1, and the second sensor unit 110.2 into the electronic multi-sensor module 10 and thus into the triggering unit 104, the multi-sensor module 10 can assume and execute additional functions in addition to the triggering function, for example additional electronic handle, lock, and/or door functions.

The actuation element 101 is arranged above the movable sensor element 117 in the handle support 105 and comprises the actuation plunger 16 which protrudes through the through opening 108 in the handle support 105 and actuates the movable sensor element 117 and consequently generates an actuation signal by means of the electronics unit 109 in order to trigger a switching function for the door lock.

Due to the design of the multi-sensor module 10 as an integrated structural unit 23 in the handle module 100 and the additional encapsulation of the multi-sensor module 10 by the potting material 15 inside and outside by the handle support 105, the actuation element 101 and the sealing strips 22, there is an additional sealing plane on the outer side of the handle module 100, so that the actuation mechanism, in particular a lifting mechanism, of the actuation element 101 is also sealed.

The integrated structural unit 23 of the multi-sensor module 10 is arranged and mounted in the handle support 105 on an inner side 107 of the handle support 105 in the region of the through opening 108 and opposite the actuation element 101, in particular can be preassembled or is preassembled as a preassembly unit. This allows a compact design of the handle module and small actuation strokes.

Figure 11:
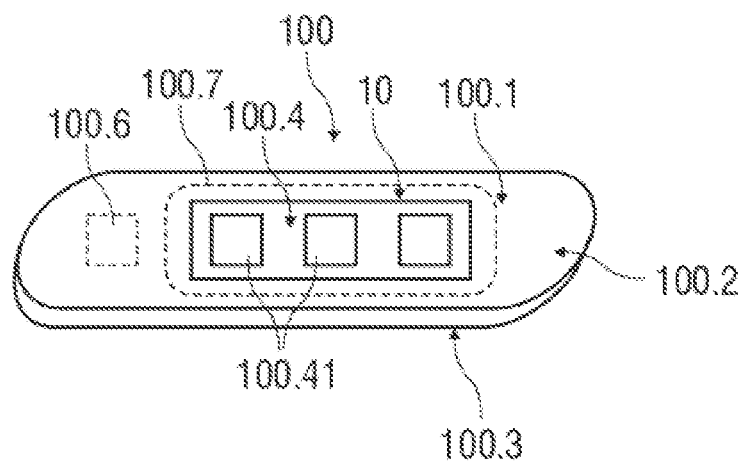
FIG. 11 is a schematic top view of a handle module.

FIG. 11 is a schematic plan view of a handle module 100 with the handle element 100.1 with the handle outer side 100.2 and the handle inner side 100.3.

The handle module 100 is also provided with the multi-sensor module 10, the approach and/or gesture sensor 100.4 with the sensor segments 100.41 being arranged on or in the handle outer side 100.2 and the actuation sensor 100.5 being arranged on or in the handle inner side 100.3 (shown in FIG. 9).

In addition, a plug connection 100.6 can be integrated, in particular molded or injected, into the handle module 100, for example in the handle support 105 and/or the actuation element 101. Optionally, an antenna 100.7, in particular an NFC antenna, can be integrated, in particular molded or injected, into the handle module 100, in particular into the handle support 105 and/or the actuation element 101.

The approach and/or gesture sensor 100.4 is used in particular for the non-contact detection of an approach and/or movement of an object, such as a hand, in the region of the handle module 100.

The actuation sensor 100.5 is used in particular to detect an actuation force, for example to detect a pressure against the handle inner side 100.3, so that it is moved inward.

Figure 12:
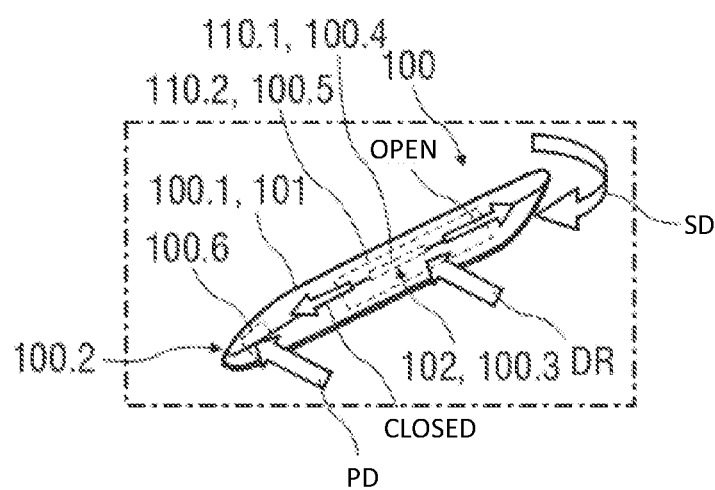
FIG. 12 is a schematic top view of a handle module, in particular a multifunction handle module which is set up for gesture control and pressure actuation.

FIG. 12 shows the handle module 100 with the operating functions possible from the combination of actuation sensor 100.5 and approach and/or gesture sensor 100.4.

In the region of the handle inner side 100.3, the handle element 100.1 comprises an actuation element 101 with an outer actuation surface 102 (directed inwardly in the direction of the body/vehicle element 201). The actuation element 101 can in particular be actuated in the pressure direction PD in order to trigger the actuation sensor 100.5 arranged in the region of the handle inner side 100.3.

Additionally or optionally, the actuation element 101 can be actuated in the swivel direction SD.

The handle module 100 also comprises the approach and/or gesture sensor 100.4 on the handle outer side 100.2, which approach and/or gesture sensor is integrated in the actuation element 101. The approach and/or gesture sensor 100.4 allows non-contact approach and/or gesture recognition and a switching function or gesture control for a closing direction CLOSED and an opening direction OPEN resulting from the detected approach or gesture.

Figure 13:
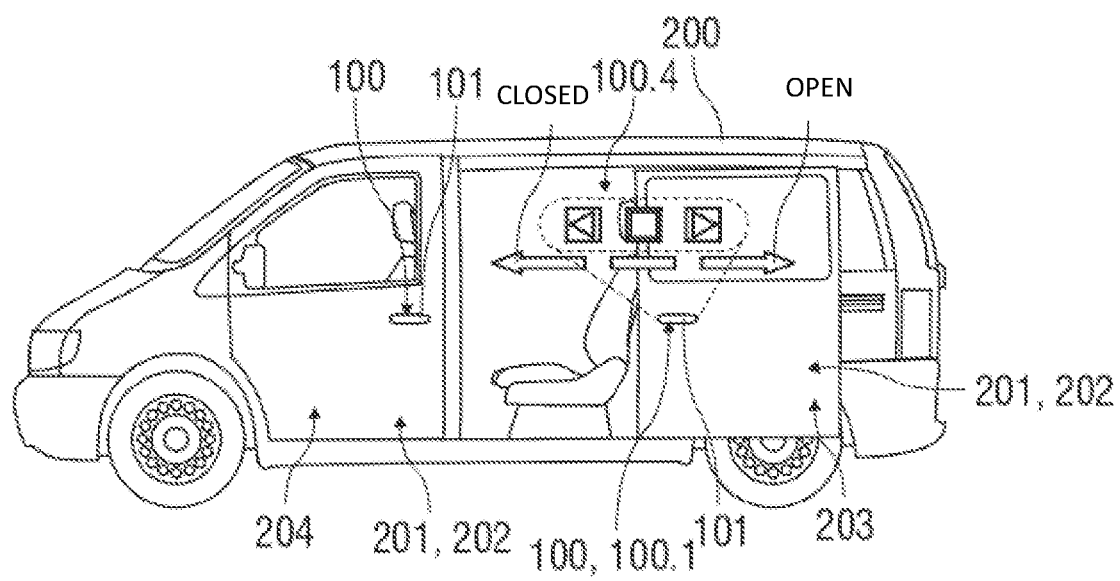
FIG. 13 is a schematic side view of a vehicle with a movable vehicle element which comprises a multifunction handle module for unlocking a door lock and for controlling handle, lock, and/or door functions.

FIG. 13 is a schematic side view of a vehicle 200 having two movable vehicle elements 201. The movable vehicle element 201 is, for example, a vehicle door 202, in particular a sliding door 203 or a pivot door 204. The vehicle element 201 comprises the handle module 100 both for unlocking a door lock and for opening the vehicle element 201 by means of the actuation sensor 100.5 and for stopping and restarting a movement of the unlocked vehicle element 201 by means of the approach and/or gesture sensor 100.4.

Figure 14:
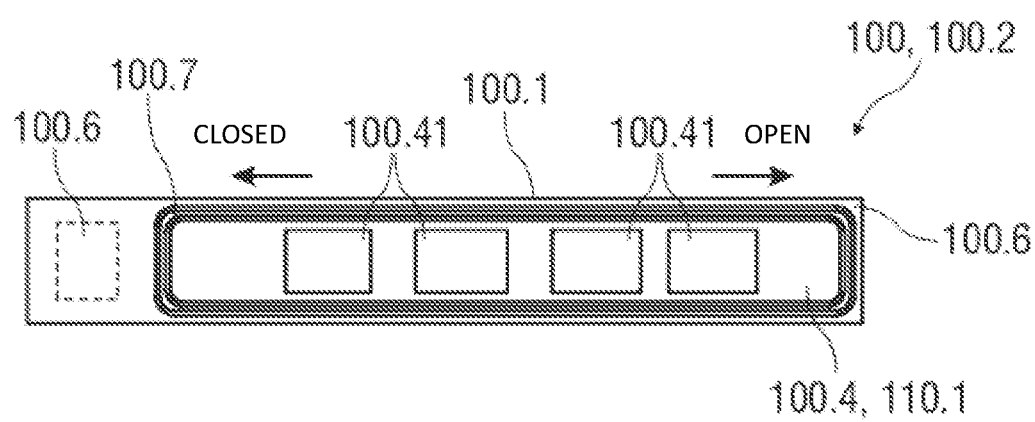
FIG. 14 is a schematic top view of the handle module with an approach and/or gesture sensor on the handle outer side and an actuation sensor on the handle inner side.

FIG. 14 shows the handle module 100 in a plan view of the handle outer side 100.2. The handle module 100 is designed as a multifunctional handle and comprises the approach and/or gesture sensor 100.4 which is integrated, in particular molded, cast, and/or arranged, on the handle outer side 100.2 in a cover 106, for example a chrome or plastics cover for the handle module 100.

Alternatively, the first sensor unit 110.1 can be integrated into the actuation element 101 of the handle element 100.1 and/or the handle support 105, for example, is injected into a wall of the actuation element 101.

The approach and/or gesture sensor 100.4 is designed, for example, as a segmented capacitive sensor with a plurality of capacitive sensor segments 100.41 which are arranged on the handle outer side 100.2 of the handle module 100, in particular in the cover 106.

Figure 15:
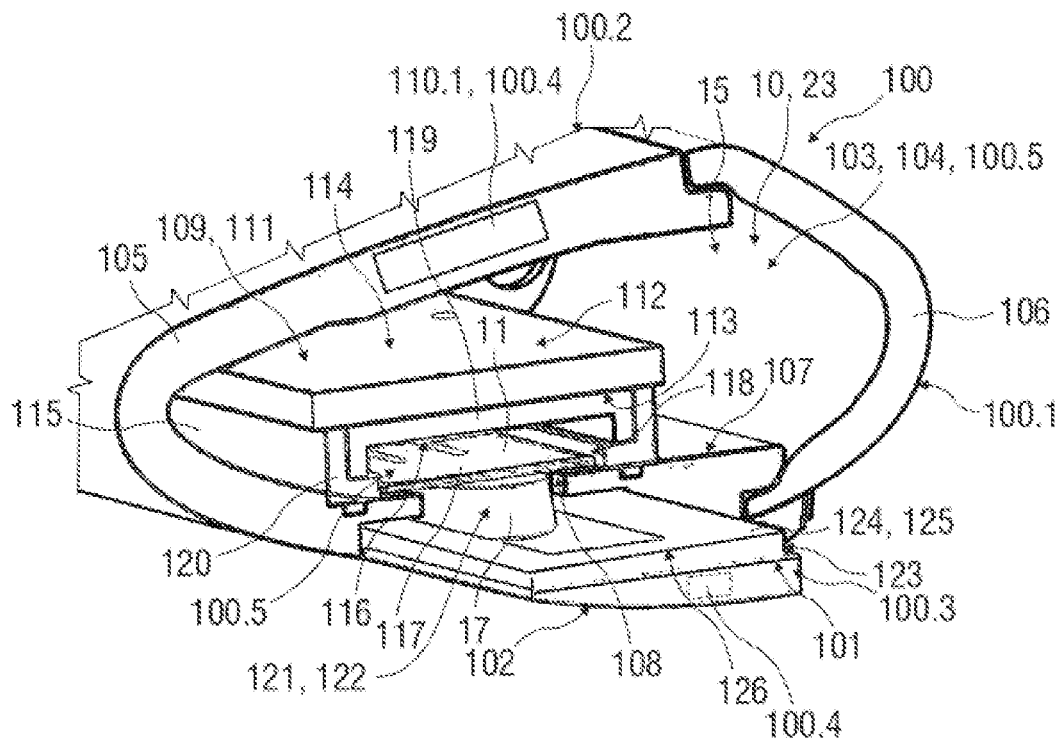
FIG. 15 shows schematically, in a partial perspective view, the handle module with an approach and/or gesture sensor on the handle outer side and an actuation sensor on the handle inner side.

The sensor segments 100.41 are combined for signaling purposes and are connected to evaluation electronics of an electronics unit 109 shown in FIG. 15, so that, for example, a non-contact wiping movement in the region of the outer approach and/or gesture sensor 100.4 due to capacitive changes in the sensor segments 100.41 is recognized. Due to the time offset of the capacitive changes in the sensor segments 100.41, a direction of the non-contact wiping movement can be detected and a movement signal for the movable vehicle element 201 in the determined direction can be triggered accordingly, so that the movable vehicle element 201 is moved in the determined direction (opening direction OPEN or closing direction CLOSED).

The actuation sensor 100.5 (shown in dashed lines) is arranged on the handle inner side 100.3 and thus on the rear of the handle element 100.1 in the region of the actuation element 101. The actuation sensor 100.5 allows for a plurality of functions, for example an unlocking function of the door lock and the movable vehicle element 201 and/or a stop/restart function of an unlocked and moving vehicle element 201.

If the movable vehicle element 201 is in the closed and locked position, for example, the door lock is unlocked and the movable vehicle element 201 is opened by selective touching, in particular pressing, the actuation surface 102 in the region of the actuation sensor 100.5 in the direction of the handle inner side. By means of the inner actuation sensor 100.5, during a movement of the vehicle element 201, the triggered movement of the vehicle element 201 can then be stopped at any desired position by selective touching again, in particular pressing, the actuation surface 102 in the region of the actuation sensor 100.5 and, if desired, can be restarted by touching again, in particular pressing, the actuation surface 102.

FIG. 15 schematically shows in a perspective partial view the handle module 100 with the mounted multi-sensor module 10 as an integrated structural unit 23, with the actuation sensor 100.5 arranged in the handle inner side 100.3 as an integrated module 103 and the approach and/or gesture sensor 100.4 arranged on the handle outer side 100.2.

Figure 16:
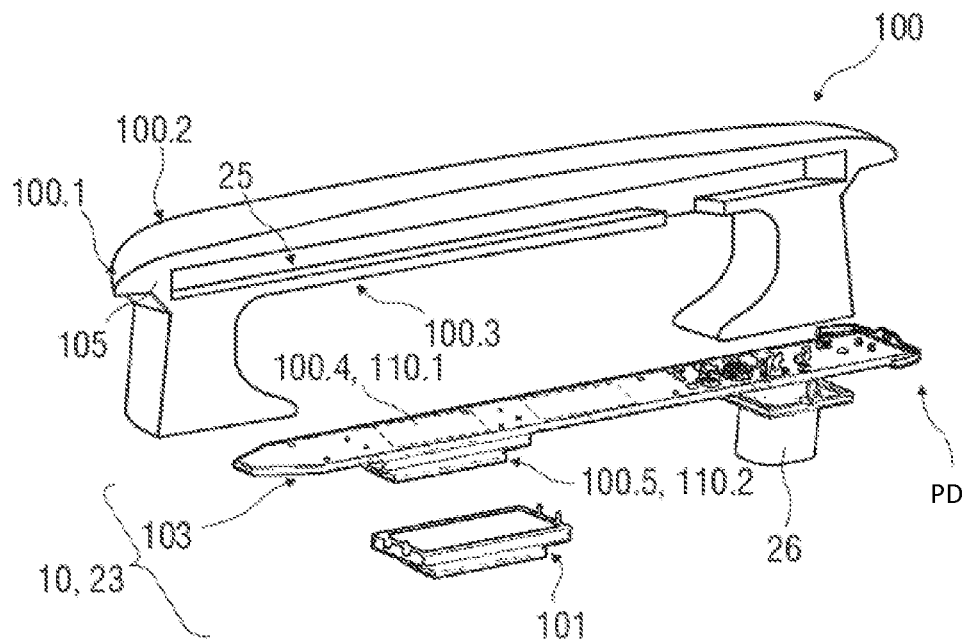
FIG. 16 is a schematic exploded view of the handle module with an approach and/or gesture sensor on the handle outer side and an actuation sensor on the handle inner side, FIG. 17 schematically shows an upper side of an electronics unit for the handle module, FIG. 18 schematically shows an underside of an electronics unit for the handle module, and FIG. 19 schematically shows, in a block diagram, components of an electronics unit of the multi-sensor module.

FIG. 16 shows an exploded view of the components of the handle module 100 with the handle element 100.1 and, as an integrated structural unit 23, the multi-sensor module 10 which can be mounted, comprising the actuation sensor 100.5 which can be arranged in the handle inner side 100.3 and arranged on the electronics unit 109 as an integrated module 103 and the approach and/or gesture sensor 100.4 which can be positioned on the handle outer side 100.2.

The actuation sensor 100.5 is designed as an integrated module 103 and forms an unlocking unit 104 for the movable vehicle element 201.

The handle module 100 is designed as an outside handle module and comprises the handle element 100.1 with the actuation element 101 with the outer actuation surface 102, the handle support 105, and the cover 106.

The actuation element 101 is held on the handle module 100, in particular on the handle support 105 and on the cover 106. Alternatively, the actuation element 101 can only be held on the handle support 105 or only on the cover 106.

The actuation element 101 forms the handle inner side 100.3. The handle support 105 and/or the cover 106 can form the handle outer side 100.2 in some regions or completely.

The handle support 105 and the cover 106 at least partially surround the multi-sensor module 10 located on the inside, which multi-sensor module as a whole can be built into and mounted as an integrated structural unit 23 in the handle module 100. For this purpose, the handle module 100 comprises, for example, a recess 25 in the handle support 105, into which the multi-sensor module 10 can be inserted or pushed as a preassembled integrated structural unit 23 and is held there in a form-fitting and/or force-fitting manner. For example, the first and second sensor units 110.1, 110.2, the electronics unit 109, the actuation element 101, and/or optionally a microswitch 26 are preassembled on the electronics unit 109 and, in the assembled state, form the integrated structural unit 23 which is then inserted into the recess 25, in particular a slot or an opening, and is held in the recess 25, for example, in a form-fitting and/or force-fitting manner, in particular by means of frictional engagement or latching.

The actuation sensor 100.5 is provided for the automatic unlocking and for the automatic opening of a door lock of the associated vehicle door 202. The actuation sensor 100.5 can be designed as a separate, integrated module 103 and preassembled on the electronics unit 109. The actuation element 101 can also be designed as a separate preassembly unit and can be preassembled on the electronics unit 109 parallel to the actuation sensor 100.5 and spaced apart therefrom.

In addition, the handle module 100 comprises the handle cover 106, for example a chrome or plastics cover.

The actuation sensor 100.5 as an integrated module 103 can be installed as a whole in the handle module 100. Due to the design of the actuation sensor 100.5 as an integrated module 103 and of the multi-sensor module 10 as an integrated structural unit 23, complex individual assembly steps are dispensed with.

In addition, due to the design of the handle module 100 with the actuation element 101, an electric door lock can be safely triggered by pressing, the electronic components of the actuation sensor 100.5 located on the inside being arranged in a protected manner. For this purpose, the actuation sensor 100.5 is protected, for example, by encapsulation, in particular additionally by means of a potting material 15.

In detail, the handle support 105, the cover 106, and the actuation element 101 surround the actuation sensor 100.5 located on the inside. Due to the design of the actuation sensor 100.5 as an integrated component 103 and the additional encapsulation of this by the handle support 105, the cover 106, and the actuation element 101, an additional sealing plane is provided on the outer side of the handle module 100, so that the actuation mechanism, in particular a lifting mechanism, of the actuation element 101 is also sealed.

The integrated component 103 is arranged and mounted in the handle support 105 on an inner side 107 of the handle support 105 in the region of a through opening 108 and opposite the actuation element 101. This allows a compact design of the handle module 100 and small actuation strokes.

The handle module 100 comprises in detail the handle element 100.1 and the multi-sensor module 10, which is formed from the actuation sensor 100.5 arranged in the region of the handle inner side 100.3 and the approach and/or gesture sensor 100.4 arranged in the region of the handle outer side 100.2.

By integrating the electronics unit 109 in combination with the actuation sensor 100.5 and the approach and/or gesture sensor 100.4 in the multi-sensor module 10 and this in turn in the handle module 100, the handle module 100 can assume and execute further functions in addition to unlocking the lock, for example further electronic handle, lock, and/or door functions.

The electronics unit 109 comprises a printed circuit board 111 having a first surface side 112 and a second surface side 113. An integrated circuit arrangement 114, for example multi-function electronics for one or more functions, in particular for one or more electronic handle, lock, and/or door functions, is arranged on the first surface side 112. The actuation sensor 100.5 is arranged on the opposite, second surface side 113.

The actuation sensor 100.5 is designed, for example, as a force sensor, in particular a force-controlled capacitive sensor, for unlocking and opening the door lock and the vehicle door 201.

In particular, the actuation sensor 100.5 is designed as a so-called MOC module (=metal-over-cap module), in which the metallic sensor components located on the inside are encapsulated from the outside.

The actuation sensor 100.5 also includes a sensor housing 115, the fixed sensor element 116, and the movable sensor element 117.

The fixed sensor element 116, in particular a metal layer, for example a copper layer, is arranged directly on the second surface side 113 of the printed circuit board 111. The movable sensor element 117 is arranged at a distance from the fixed sensor element 116 in a receiving opening 118 of the sensor housing 115. The movable sensor element 117 is a metal spring, in particular a metal sheet. The fixed sensor element 116 and the movable sensor element 117 form electrodes of the actuation sensor 100.5.

The actuation sensor 100.5 located on the inside is acted upon by force, for example by a pressure force on the handle inner side 100.3. If the force exceeds a specified threshold value, this is identified as an opening request and the door lock is safely unlocked. The unlocking is triggered, for example, by pressing the handle module 100 on the handle inner side 100.3 against the actuation surface 102 in the direction of the vehicle body, so that the actuation element 101 is pressed into the handle inner side. With a sufficiently large actuation stroke of the actuation element 101 into the handle inner side, the actuation element 101 takes along the movable sensor element 117, in particular a spring sheet or a metal spring and also presses it into the handle inner side, whereby the distance from the fixed sensor element 116, in particular a metal layer, for example a copper layer on the second surface side 113 of the printed circuit board 111, is changed, and, when a predetermined threshold value is exceeded, an opening signal is generated and, for example, the door lock is unlocked or door movement is stopped.

The sensor housing 115 and the movable sensor element 117 encapsulate, from the outside, the fixed sensor element 116 located on the inside. The sensor housing 115 is in particular a plastics housing and can be molded, in particular injection molded, onto the printed circuit board 111. The sensor housing 115 can be designed as a 2-component housing. For example, the sensor housing 115 can have a soft housing wall 119 located on the inside and an outer hard housing wall 120 surrounding it.

When the integrated module 103 is in the built-in state in the handle module 100, the movable sensor element 117 is arranged in the region of the through opening 108 in such a way that it at least partially covers the through opening 108 from the inside.

The actuation element 101 is arranged in the region of the through opening 108 in such a way that it at least partially covers the through opening 108 from the outside. In particular, the actuation element 101 protrudes into the through opening 108 at least in some regions in such a way that, in an unactuated position, as shown in FIG. 15, it is arranged spaced apart from the movable sensor element 117.

This allows a compact design of the handle module and small actuation strokes. In addition, the actuation forces are adjustable; in particular, threshold values for the actuation stroke can be specified. For example, threshold values for the actuation stroke can be specified so that unlocking of the door lock is only triggered when the actuation stroke has exceeded the specified threshold value. If, however, a threshold value for the actuation stroke is not reached, the door lock is not unlocked. The threshold values for the actuation stroke can also vary as a function of the recorded values of further parameters, such as, for example, air humidity, temperature, speed of the vehicle, etc., and can thus be dynamically adapted accordingly. For this purpose, the electronics unit 109 includes appropriate filters, software logics, and/or analysis modules. In addition, the encapsulation by means of the foam material 11 and the sealing by means of the sealing strands 22 allow tolerance compensations, in particular the compensation of manufacturing tolerances for calibrating the sensor units 110.1, 110.2.

In addition, the actuation element 101 can comprise a pressure transmission element 121 that protrudes inward from the outer actuation surface 102 on the handle inner side in the direction of the actuation sensor 100.5. For example, the actuation element 101 comprises an inwardly protruding pressure pin 122 which, when the actuation element 101 is actuated, can be moved in the pressure direction PD and thus in the direction of the movable sensor element 117.

The actuation element 101 can be actuated by pressure in such a way that it can be moved in the pressure direction PD through the through opening 108 up to the upper sensor part 117 and this is moved in the direction of the fixed sensor element 116 upon further pressure actuation. As a result, the distance between the movable sensor element 117 and the fixed sensor element 116 is reduced, so that a measuring field of the actuation sensor 100.5 present between them changes.

To detect this change in the measuring field, the actuation sensor 100.5 is designed as a capacitive pressure sensor, the fixed sensor element 116 and the movable sensor element 117 forming the electrodes which are signal-coupled to an electronic switching unit of the electronics unit 109 on the rear side (=first surface side 112) of the printed circuit board 111. If the electronic switching unit detects a correspondingly large change in the measuring field due to the actuation of the pressure, the door lock is opened automatically.

For this purpose, the movable sensor element 117 is designed, for example, as a spring plate or a spring sheet.

Furthermore, the actuation element 101 has an inner side 123 opposite the outer actuation surface 102, which inner side is sealingly connected to the handle support 105 by means of a connecting element 124, at least in the region of the through opening 108. In other words: The actuation element 101 is connected, in particular glued, to the handle support 105 by means of the connecting element 124.

The connecting element 124 can additionally be designed as a resetting element 125 which, when the actuation element 101 is actuated from an unactuated position to an actuated position, resets it to the unactuated position when the actuation element is not actuated.

For this purpose, the connecting element 124 is designed, for example, as a plastics strand, in particular as a rubber or foam strand. In particular, the connecting element 124 is formed from a soft component material, in particular from a foam, plastics or rubber material. For example, the connecting element 124 is formed from a PUR foam, in particular a CeraPur foam.

On the inner side 123 of the actuation element 101 facing the actuation sensor 100.5, the connecting element 124 can moreover form a circumferential sealing strand 126 arranged in the edge region of the through opening 108.

Alternatively or additionally, the connecting element 124 can surround the actuation element 101 on the inner side 123 facing the actuation sensor 100.5 and seal it against moisture and contamination.

The connecting element 124 thus takes on a plurality of functions: at least sealing, fastening, and resetting. In addition, the connecting element 124 can serve to dampen vibrations.

Figure 17:
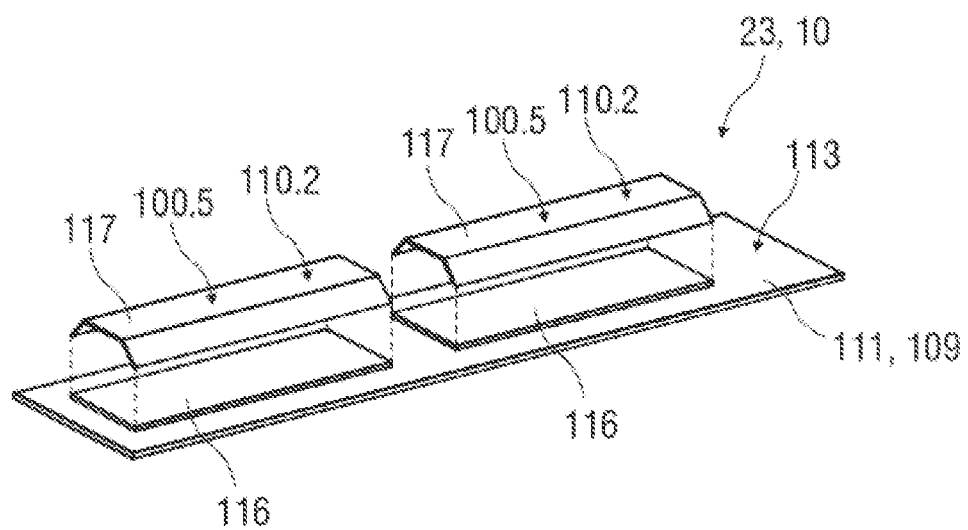
Figure 18:
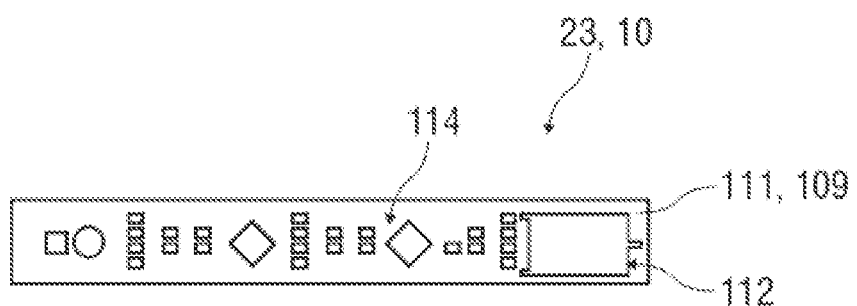

FIG. 17, 18 schematically show an upper and lower side of the integrated structural unit 23 for the multi-sensor module 10, which structural unit forms a separate assembly module. The integrated structural unit 23 comprises the printed circuit board 111 with the first surface side 112 and the second surface side 113. The integrated circuit arrangement 114 of the electronics unit 109, for example multi-function electronics for one or more functions, in particular for one or more electronic handle, lock, and/or door functions, is arranged on the first surface side 112. The actuation sensor 100.5 is arranged on the opposite, second surface side 113. In this case, its movable sensor element 117 can be encapsulated by means of foam material 11 and preassembled as a separate integrated component 103 on the printed circuit board 111. The fixed sensor element 116 can optionally be part of the printed circuit board 111 or part of the integrated component 103. In addition, the actuation sensor 100.5 can be provided with potting material 15.

For the sake of clarity, the connection elements 12 of the movable sensor element 117 are not shown in this illustration.

Figure 19:
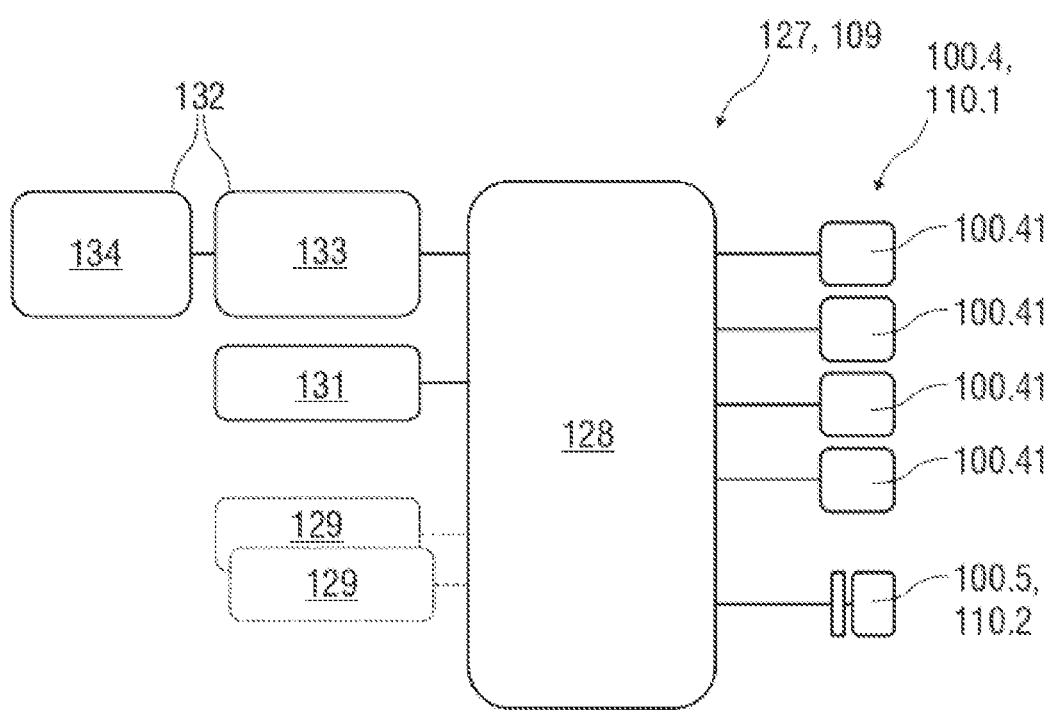

FIG. 19 is a schematic block diagram of components of an electronic circuit 127 of the electronics unit 109 for the actuation sensor 100.5 (=second sensor unit 110.2) and the approach and/or gesture sensor 100.4 (=first sensor unit 110.1). The electronic circuit 127 is part of the integrated circuit arrangement 114 of the printed circuit board 111 and comprises, for example, a microcontroller 128. The microcontroller 128 comprises software logic, by means of which the measurement field changes detected by the actuation sensor 100.5 and/or the approach and/or gesture sensor 100.4 are analyzed and corresponding trigger signals, for example for unlocking and opening the door lock, and/or for stopping or restarting the vehicle element 201, can be generated.

The approach and/or gesture sensor 100.4 comprises a plurality of capacitive sensor segments 100.41 as a segmented capacitive sensor, for example. The sensor segments 100.41 are combined for signaling purposes and connected to the microcontroller 128, so that, for example, a non-contact wiping movement in the region of the outer gesture sensor 100.4 is recognized due to capacitive changes in the sensor segments 100.41. Due to the time offset of the capacitive changes in the sensor segments 100.41, a direction of the non-contact wiping movement can be detected and a movement signal for the movable vehicle element 201 in the determined direction generated by means of the logic of the microcontroller 128 can be triggered accordingly and are transmitted to an actuation unit of the vehicle element 201 via an input/output interface 131, so that the movable vehicle element 201 is moved in the determined direction.

By means of the internal actuation sensor 100.5, selective touching of the actuation surface 102 can then be detected and identified as a stop request using the logic of the microcontroller 128 in order to generate a stop signal and transmit it to the actuation unit of the vehicle element 201, whereby the movement of the vehicle element 201, such as a door, can be stopped at any desired position. Another touch, in particular pressing, of the actuation surface 102 of the stopped vehicle element 201 is detected by the actuation sensor 100.5 and detected as a restart request by means of the logic of the microcontroller 128, so that the microcontroller 128 generates a further control signal for the actuation unit of the vehicle element 201 and transmits it to the control unit, so that the vehicle element 201 is restarted.

In addition, a locking sensor 130 can optionally be integrated in the handle module 100, the microcontroller 128 using a detected locking signal from the locking sensor 130 to generate a locking command for the door lock when the vehicle element 201 is closed but not yet locked, in particular when the door, front hood/engine hood, or tailgate is closed and not yet locked and is transmitted to an actuation unit for the door lock for automatic locking of the door lock.

Furthermore, the software logic of the microcontroller 128 can be designed so that when the unlocked vehicle door 202 is moved, the movement of the vehicle door 202 can be stopped at any position if a change in the measuring field of the actuation sensor 100.5 is identified due to a renewed pressing of the actuation element 101.

Thus, the actuation sensor 100.5 coupled with the integrated circuit arrangement 114 allows both unlocking and thus opening the door lock by pressing the actuation element 101 and stopping the moving vehicle door 202 at any desired position by pressing the actuation element 101 again.

The microcontroller 128 can include further software functions for the door lock, the vehicle door 202, and/or the handle module 100. For this purpose, the microcontroller 128 is coupled to other components, for example via one or more communication interfaces 129, for example a LIN interface or a CAN interface. Furthermore, further sensors optionally implemented in the handle module 100, for example further capacitive sensors for detecting an approach, can be signal-coupled to the microcontroller 128.

Furthermore, the microcontroller 128 can be signal-coupled via further input and output interfaces 131 with other electronic components or external, mobile devices, such as a mobile phone.

In addition, the microcontroller 128 can be signal-coupled to further software modules 132, for example a voltage regulator 133 and/or an EMC protective device 134.

In addition, threshold value modules, filter modules, rain modules, disruption modules, time modules, speed modules can be implemented as software modules in the microcontroller 128 to identify an actuation of the actuation element 101, which, for example, dynamically adjusts threshold values to identify a change in the measuring field, depending on temperature, rain, EMC interference, operating speed, and/or air humidity, in order to determine a pressure actuation of the actuation element 101 reliably and quickly.

For example, in the event of a strong signal swing in a fast trigger time, no relevant actuation and thus no trigger signal for unlocking the door lock is generated.

With a slow operating speed, a trigger signal for unlocking is generated when the signal level exceeds the specified threshold value.

For example, a value of 2 mm is specified as the threshold value for an actuation stroke.

LIST OF REFERENCE SIGNS

10 Multi-sensor module
11 Foam material
12 Connection element
13 Through opening
14 Base element
15 Potting material
16 Actuation plunger
17 Counter plunger
18 Spacer element
19 Shielding
20 Measuring field
21 Sensor housing
22 Sealing strand
23 Integrated structural unit
24 Connection surface
25 Recess
26 Microswitch
100 Handle module
100.1 Handle element
100.2 Handle outer side
100.3 Handle inner side
100.4 Approach and/or gesture sensor
100.41 Sensor segment
100.5 Actuation sensor
100.6 Plug connection
100.7 Antenna
101 Actuation element
102 Actuation surface
103 Integrated component
104 Unlocking unit
105 Handle support
106 Cover
107 Inner side
108 Through opening
109 Electronics unit
110.1 First sensor unit
110.2 Second sensor unit
111 Printed circuit board
112 First surface side
113 Second surface side
114 Integrated circuit arrangement
115 Sensor housing
116 Fixed sensor element
117 Movable sensor element
118 Receiving opening
119 Soft housing wall
120 Hard housing wall
121 Force transmission element
122 Pressure pin
123 Inner side
124 Connecting element
125 Resetting element
126 Sealing strand
127 Electronic switch
128 Microcontroller
129 Communication interface
130 Locking sensor
131 Input and output interface
132 Software module
133 Voltage regulator
134 EMC protective device
200 Vehicle 201 Movable vehicle element
202 Vehicle door
203 Sliding door
204 Pivot door
OPEN Opening direction
PD Pressure direction
A1, A2 Arrow
SD Swivel direction
CLOSED Closing direction

The invention claimed is:

1. A multi-sensor module for a handle, comprising:
one first sensor unit which is designed as an approach and/or gesture sensor,
one second sensor unit which is designed as an actuation sensor, and
one electronics unit which is electrically connected to the sensor units for triggering a signal,
wherein the actuation sensor is designed as a component which is encapsulated and integrated by a foam material at least in some regions and is mounted on one side of the electronics unit, and
wherein the approach and/or gesture sensor is designed to be a plurality of sensor elements and is mounted on an opposite side of the electronics unit.

2. The multi-sensor module according to claim 1, wherein the encapsulated and integrated component forms a preassembly unit which can be mounted on the electronics unit in a preassembly state.

3. The multi-sensor module according to claim 1, wherein the multi-sensor module is additionally surrounded at least in some regions by a potting material and is designed as an integrated structural unit.

4. The multi-sensor module according to claim 1, wherein connection elements of the actuation sensor protrude from the foam material and can be or are connected to the electronics unit.

5. The multi-sensor module according to claim 1, wherein the actuation sensor comprises a movable sensor element and a fixed sensor element arranged spaced apart from and opposite the movable sensor element, wherein at least the movable sensor element is separately encapsulated by the foam material at least in some regions and forms the integrated component, wherein connection elements of the movable sensor element protrude from the foam material and can be or are connected to the electronics unit.

6. The multi-sensor module according to claim 4, wherein the connection elements are designed as surface connection elements.

7. The multi-sensor module according to claim 1, wherein the first sensor unit and/or the second sensor unit are each additionally surrounded at least in some regions by a potting material.

8. The multi-sensor module according to claim 1, wherein the first sensor unit is designed as a capacitive sensor.

9. The multi-sensor module according to claim 1, wherein the second sensor unit is designed as a force sensor, comprising a force-controlled capacitive or an inductive sensor, for performing a switching function comprising unlocking a door lock or opening a door.

10. The multi-sensor module according to claim 5, wherein an actuation element is provided for actuating the movable sensor element and is arranged above and/or below the movable sensor element.

11. The multi-sensor module according to claim 10, wherein the actuation element is encapsulated in some regions or completely by the foam material and is part of the integrated component.

12. An outside handle module for a movable vehicle element of a vehicle, comprising:
one handle element and
one multi-sensor module according to claim 3 designed as the integrated structural unit which can be mounted as an assembly unit on or in the handle element.

13. The handle module according to claim 12, wherein the handle element has a handle outer side and a handle inner side,
wherein the integrated structural unit can be mounted in the handle element in such a way that the approach and/or gesture sensor is arranged on or in the handle outer side and the actuation sensor is arranged on or in the handle inner side.

14. The handle module according to claim 13, wherein the handle element comprises an actuation element having an outer actuation surface and a handle support on which the actuation element is held, and wherein the actuation element is arranged on the handle outer side and the handle support is arranged on the handle inner side.

15. The handle module according to claim 12, wherein the approach and/or gesture sensor is designed as a segmented capacitive sensor with a plurality of capacitive sensor segments which are arranged in the actuation element in the region of the outer actuation surface and/or on the surface side of the electronics unit facing the handle outer side.

16. A movable vehicle element having the handle module according to claim 12, in or on which the multi-sensor module can be arranged or is arranged.

17. A multi-sensor module for a handle, comprising:
an approach and/or gesture sensor,
an actuation sensor, and
one electronics unit which is electrically connected to the sensor units for triggering a signal,
wherein the actuation sensor is at least partially encapsulated by a foam material and is mounted on one side of the electronics unit, wherein the approach and/or gesture sensor is mounted on an opposite side of the electronics unit,
wherein the actuation sensor comprises a movable sensor element and a fixed sensor element arranged spaced apart from and opposite the movable sensor element,
wherein at least the movable sensor element is separately encapsulated by the foam material at least in some regions and forms the integrated component, and wherein connection elements of the movable sensor element protrude from the foam material and are connected to the electronics unit.

18. The multi-sensor module according to claim 1, wherein the electronics unit has an upper side and a lower side, and the plurality of sensor elements is equally spaced from one another on the lower side of the electronics unit.

* * * * *